United States Patent [19]
Lou

[11] Patent Number: 5,406,219
[45] Date of Patent: Apr. 11, 1995

[54] DIFFERENTIAL-TO-SINGLE-ENDED CONVERTER

[75] Inventor: Perry W. Lou, Carlsbad, Calif.

[73] Assignee: Brooktree Corporation, San Diego, Calif.

[21] Appl. No.: 16,131

[22] Filed: Feb. 10, 1993

[51] Int. Cl.⁶ .......................... H03K 5/153; H03F 3/45
[52] U.S. Cl. ..................................... 330/253; 330/257; 330/292; 330/277; 330/301
[58] Field of Search ................ 330/253, 257, 292, 277, 330/301

[56] References Cited

U.S. PATENT DOCUMENTS 5,113,092  5/1992  Herold ............................ 330/253 X

FOREIGN PATENT DOCUMENTS 1048409  9/1982  Japan .................................. 330/257
0000107  1/1985  Japan .................................. 330/253

OTHER PUBLICATIONS

IBM Technical Disclosure Bulletin vol. 16 No. 10 Mar. 1974.

Primary Examiner—William L. Sikes
Assistant Examiner—Fetsum Abraham
Attorney, Agent, or Firm—Ellsworth R. Roston; Charles H. Schwartz

[57] ABSTRACT

First and second transistors respectively receive differential input signals each having first and second logic levels and respectively produce resultant currents dependent upon the levels of the input signals. The transistors may be CMOS transistors of the n-type with substantially identical characteristics. The input signals may be introduced to the gates of these transistors and the resultant currents may be produced at the drains of these transistors. Third and fourth transistors may receive the resultant currents. The third and fourth transistors may be CMOS transistors of the n-type with substantially identical characteristics. The resultant voltage at the first transistor may be introduced in a modified form to the third and fourth transistors to regulate the resultant voltage introduced to the third transistor and to expedite the response of the fourth transistor. The modification may be an inversion of the resultant voltage at the first transistor, the inversion being produced by an amplifier-inverter in a servo loop with the third transistor. The currents on the drains of the first and second transistors may be respectively introduced to the sources of the third and fourth transistors. The modified (or inverted) voltage from the drain of the first transistor may be introduced to the gates of the third and fourth transistors. An output voltage may be provided at the source of the fourth transistor. The output voltage may be inverted as by an amplifier-inverter having characteristics substantially identical to those of the amplifier-inverter in the servo loop.

13 Claims, 3 Drawing Sheets

VOLTAGE AT OUTPUT LINE 24

DIFFERENTIAL-TO-SINGLE-ENDED CONVERTER

This invention relates to a converter for providing a single-ended output in response to a differential input. More particularly, the invention relates to a converter in which the single-ended output provides a fast response to the differential input.

Circuits are known for converting a differential input to a single-ended output. One type of circuit is formed from CMOS transistors. This circuit uses a pair of n-type of CMOS transistors for receiving individual ones of the differential inputs and for respectively producing resultant currents related to such inputs. Individual ones of p-type CMOS transistors in a pair respectively receive the individual ones of the resultant currents.

The circuit described in the previous paragraph has certain significant disadvantages. One disadvantage is that the circuit does not have the same response from a time stand-point to input signals of high and low logic levels. Specifically, the response of the circuit to an input signal of a high logic level is relatively slow. This results in part from the fact that CMOS transistors of the p-type have a slow response. It also results from the fact that the distributed capacitances in the CMOS transistors of the p-type delay the response of these transistors.

The circuit described above also has other significant disadvantages. One of these disadvantages is that the single-ended output from the circuit is a high-impedance node which is relatively poorly located. That is, small changes in the currents at the drain of the p-type and n-type transistors at the output side of the transistors can easily modify the quiescent output voltage by a magnitude of several volts. The circuit also tends to have a limited bandwidth as a result of the current mirror provided between the input and the output and from the high output impedance.

In one embodiment of the invention, first and second transistors respectively receive different input signals each having first and second logic levels respectively and respectively produce resultant voltages dependent upon the logic levels of the input signals. The first and second transistors may be MOS transistors having substantially identical characteristics. The input signals may be introduced to the gates of these transistors and the resultant currents may be produced at the drains of these transistors.

Third and fourth transistors may receive the resultant voltages. The third and fourth transistors may be MOS transistors of the n-type with substantially identical characteristics. The resultant voltage at the first transistor may be introduced in a modified form to the third and fourth transistors to regulate the resultant voltage introduced to the third transistor and to expedite the response of the fourth transistor. The modification may be an inversion of the resultant voltage at the first transistor, the inversion being produced by an amplifier-inverter in a servo loop with the third transistor.

The resultant currents on the drains of the first and second transistors may be respectively introduced to the sources of the third and fourth transistors. The modified (or inverted) voltage from the drain of the first transistor may be introduced to the gates of the third and fourth transistors. An output voltage may be provided at the source of the fourth transistor. The output voltage may be inverted as by an amplifier-inverter having characteristics substantially identical to those of the amplifier-inverter in the servo loop.

Figure 1:
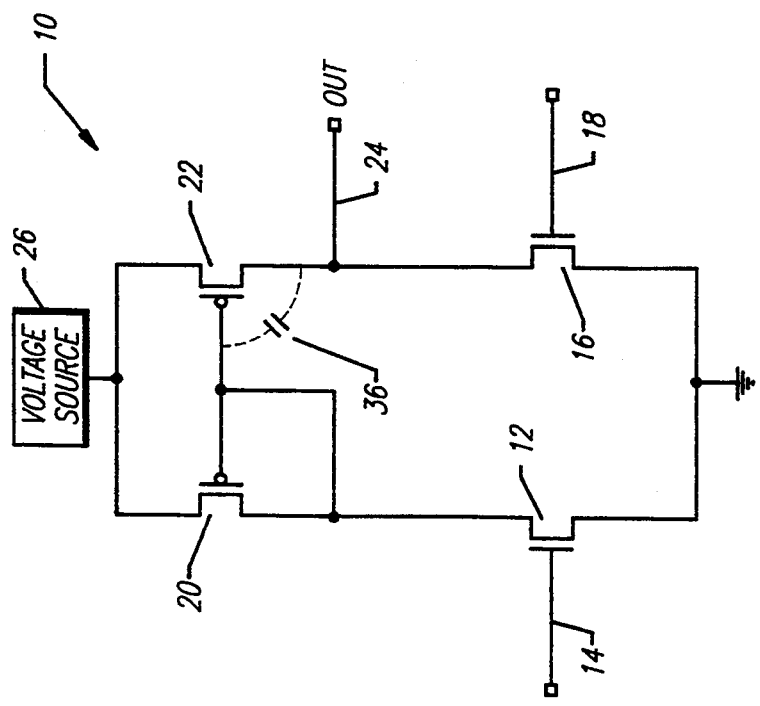
FIG. 1 is a circuit diagram of a circuit of the prior art for converting a differential input to a single-ended output.

In the prior art embodiment shown in FIG. 1, a circuit generally indicated at 10 is provided for converting a differential input to a single-ended output. The circuit 10 includes a transistor 12 for receiving an input signal on a line 14 at the gate of the transistor. The input signal may have first (e.g. high) and second (e.g. low) logic levels respectively representing a binary "1" and a binary "0". The gate of a transistor 16 receives a differential signal on a line 18. The differential signal has the second logic level when the input signal has the first logic level and vice versa. The transistors 12 and 16 may be MOS transistors of the n-type and may have substantially identical characteristics. The drains of the transistors 12 and 16 may be at a common reference potential such as ground.

A pair of transistors 20 and 22 may be of the p-type and may have substantially identical characteristics. The drain and the gate of the transistor 20 may be common with the gate of the transistor 22. The drain of the transistor 20 is common with the drain of the transistor 12 and the drain of the transistor 22 has a common connection with the drain of the transistor 16. The voltage on the drain of the transistor 22 is provided on an output line 24 as the output voltage. The sources of the transistors 20 and 22 receive an energizing voltage such as approximately +5 volts from a source 26.

Figure 2:
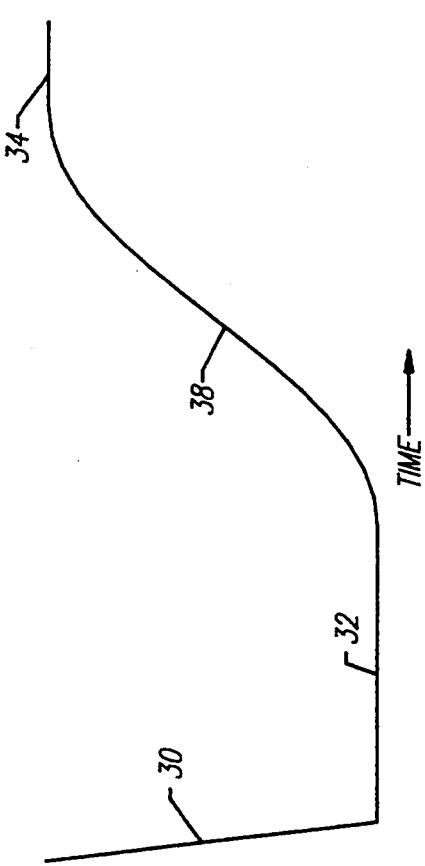
FIG. 2 is a curve schematically illustrating an output voltage produced on an output line in the circuit shown in FIG. 1.

When an input signal having a low logic level is applied to the gate of the transistor 12, the transistor becomes non-conductive. A voltage of high amplitude is accordingly applied to the gates of the transistors 20 and 22. At the same time, a low voltage is applied to the drain of the transistor 22 and the output line 24 because of the state of conductivity in the transistor 16. The transistor 16 is conductive because of the introduction of a differential signal of a high logic level to its gate. The low voltage on the output line 24 is produced almost instantaneously as indicated in FIG. 2 at 30 because of the instantaneous responses of the transistors 12, 16 and 22. The production of the low voltage on the output line 24 is indicated schematically at 32 in FIG. 2.

When the amplitude of the input signal on the line 18 becomes low, the transistor 16 becomes cut off. This causes a relatively high voltage to be produced on the drain of the transistor 22. At the same time, the high voltage on the line 14 causes the transistor 12 to become conductive so that a low voltage is produced on the gate of the transistor 22 to produce a state of conductivity in the transistor. The resultant flow of current through the transistor 22 causes a voltage approaching the voltage from the source 26 to be produced on the line 24. This high voltage is indicated at 34 in FIG. 2.

As indicated schematically by broken lines in FIG. 1, a distributed capacitance 36 is provided between the gate and the drain of the transistor 22. This distributed capacitance is well known in the art since it is inherent in the construction of transistors such as the transistor 22. When a low voltage is produced on the gate of the transistor 22 and a high voltage is simultaneously produced on the drain of the transistor, a current flows through the distributed capacitance 36 to charge the capacitance. This flow of current impedes the response of the transistor 22. As a result, the production of the output voltage of high amplitude on the line 24 is slowed as indicated at 38 in FIG. 2.

The slow production of the voltage on the line 32 has certain disadvantages. It provides an asymmetrical output voltage on the line 24. It also delays the production of the output voltage on the line 24 when the input voltage on the line 14 becomes high. The circuit shown in FIG. 1 also has a limited bandwidth as a result of the current mirror provided by the transistor 22 and the high output impedance on the line 24. Furthermore, the output line 24 is poorly located in the sense that small changes in the drain currents of the transistors 16 and 22 can easily produce a change of several volts in the quiescent voltage on the line 24.

Figure 3:
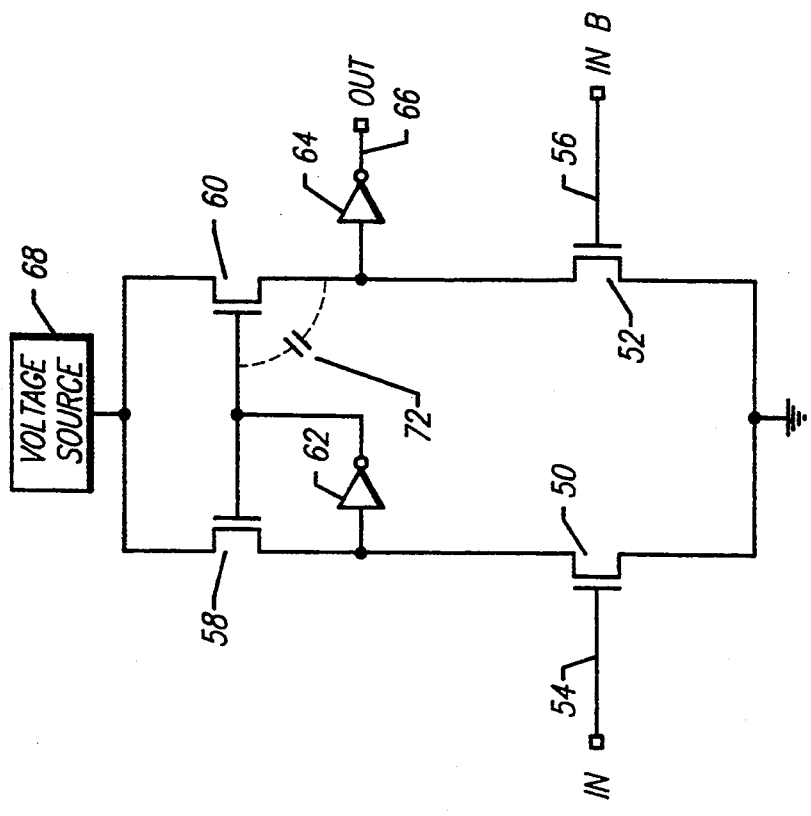
FIG. 3 is a circuit diagram of one embodiment of the invention for converting a differential input to a single-ended output.

FIG. 3 illustrates a circuit constituting one embodiment of the invention. The circuit shown in FIG. 3 includes a pair of transistors 50 and 52 respectively corresponding to the transistors 12 and 16 in FIG. 1. The transistors 50 and 52 may be MOS transistors of the n-type with substantially identical characteristics. The gates of the transistors 50 and 52 respectively receive differential signals on lines 54 and 56, the signal on the line 54 constituting the input signal. The sources of the transistors 50 and 52 are at a common reference potential such as ground.

The drains of the transistors 50 and 52 are respectively connected to the sources of transistors 58 and 60. The transistors 58 and 60 are preferably MOS transistors of the n-type with substantially identical characteristics. The source of the transistor 58 has a common connection with the input to an amplifier-inverter 62. The output of the amplifier-inverter 62 is connected to the gates of the transistors 58 and 60. The voltage on the source of the transistor 60 is inverted by an amplifier-inverter 64 and the inverted voltage is introduced to a line 66. The drains of the transistors 58 and 60 receive energizing voltages from a source 68.

When the differential voltage introduced to the gate of the transistor 52 is high, current flows through the transistor and produces a low voltage on the drain of the transistor. This voltage is inverted by the amplifier-inverter 64 to a high voltage on the line 66. At the same time, the input signal introduced to the gate of the transistor 50 has a low amplitude. This causes the transistor 50 to be non-conductive and a relatively high voltage to be produced on the drain of the transistor. The high voltage on the drain of the transistor 50 is inverted by the amplifier-inverter 62 and the inverted voltage is introduced to the gate of the transistor 58 to minimize the current through the transistor. This assures that the voltage at the source of the transistor 60 is low.

Figure 4:
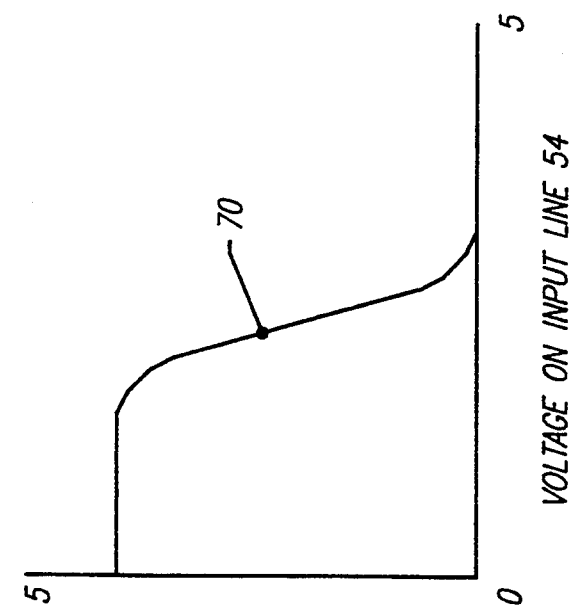
FIG. 4 is a curve illustrating the relationship between input and output voltages of a particular transistor in the embodiment shown in FIG. 3.

The inverter-amplifier 62 forms a closed-loop servo with the gate and the source of the transistor 58. Because of this, when a high voltage is produced on the drain of the transistor 50 and is inverted by the amplifier-inverter 62, the transistor 58 tends to become non-conductive so that a low voltage would tend to be produced on the drain of the transistor 50. The voltage on the drain of the transistor 50 and the source of the transistor 58 accordingly singular to become regulated at an intermediate value indicated at 70 in FIG. 4. This corresponds to the switching voltage of the amplifier-inverter 62. In FIG. 4, the horizontal axis indicates the voltage on the gate of the transistor 50 and the vertical axis indicates the voltage on the source of the transistor 60.

When the input signal on the gate of the transistor 50 becomes high, the transistor 50 becomes conductive to obtain the production of a low voltage on the drain of the transistor. This low voltage is inverted by the amplifier-inverter 62 so that a high voltage is introduced to the gate of the transistor 60 to make the transistor conductive. A high voltage accordingly tends to be produced at the drain of the transistor 60. This voltage is inverted by the amplifier-inverter 64 to produce a low voltage on the line 66.

At the same time that a high voltage is introduced to the gate of the transistor 50, a low voltage is introduced to the gate of the transistor 52. This causes the transistor 52 to become non-conductive and a high voltage to be produced on the source of the transistor 60. Since a high voltage is simultaneously produced on the gate of the transistor 60, very little voltage difference exists between the gate and the source of the transistor. Because of this, there is relatively little current through the distributed capacitance 72 between the gate and the source of the transistor 60. This causes the transistor 60 to respond quickly to the high voltage on the gate of the transistor. In this way, the transistor 60 becomes instantaneously conductive so that a high voltage is instantaneously produced on the source of the transistor and a low voltage is instantaneously produced on the line 66.

When the differential input on the gates of the transistors 50 and 52 is zero (0), the voltages on the sources of the transistors 58 and 60 are equal. This is the switching voltage of the amplifier-inverter 62. Thus, when the amplifier-inverter 64 has substantially the same characteristics as the amplifier-inverter 62, the amplifier-inverter 64 is automatically at its switching point. This enhances the ability of the circuit shown in FIG. 4 to provide an instantaneous response to the differential signals introduced to the gates of the transistors 50 and 52.

Figure 5:
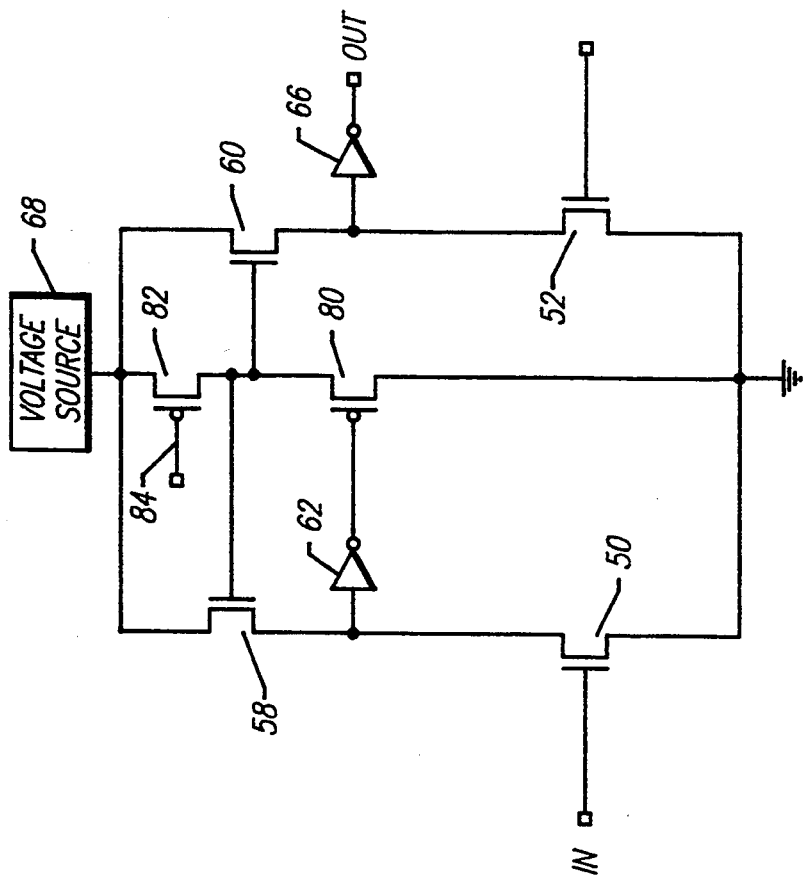
FIG. 5 is a circuit diagram of another embodiment of the invention for converting a differential input to a single-ended output.

FIG. 5 is a circuit diagram of another embodiment of the invention. The embodiment shown in FIG. 5 is similar to the embodiment shown in FIG. 3 except that it includes additional transistors 80 and 82. Each of the transistors 80 and 82 may be a MOS transistor of the p-type. The drain of the transistor 80 is at the reference potential such as ground. The gate of the transistor 80 has a common connection with the output end of the amplifier-inverter 62. The source of the transistor 80 is common with the gates of the transistors 58 and 60 and with the drain of the transistor 82. The gate of the transistor 82 receives a fixed bias on a line 84 so that a substantially constant current flows through the transistor. The source of the transistor 84 is connected to the voltage source 68.

As will be appreciated, a voltage drop occurs between the gate and the source of the transistor 58. The transistor 80 operates as a source follower and produces a voltage between the gate and the source of the transistor. This voltage increases the voltage on the drain of the transistor 82 by an amount corresponding substantially to the voltage drop between the gate and the source of the transistor 58. The transistor 80 accordingly compensates for voltage decreases between the gate and the source of the transistor 58. The transistor 80 also provides a decrease in the impedance at the gate of the transistor 60. Furthermore, since the source follower provided by the transistor 80 has a relatively high bandwidth, it does not destabilize the loop which includes the amplifier-inverter 62 and the gate and drain of the transistor 58.

With an appropriate bias voltage on the gate of the transistor 82, the voltage between the gate and the source of the transistor 80 may be set equal to the voltage between the gate and source of the transistor 58. This causes the voltage in the quiescent state at the input to the amplifier-inverter 62 to be equal to the voltage at the output of the amplifier-inverter and the voltage at the input of the amplifier-inverter 66 to be equal to the voltage at the output of the amplifier-inverter.

Figure 6:
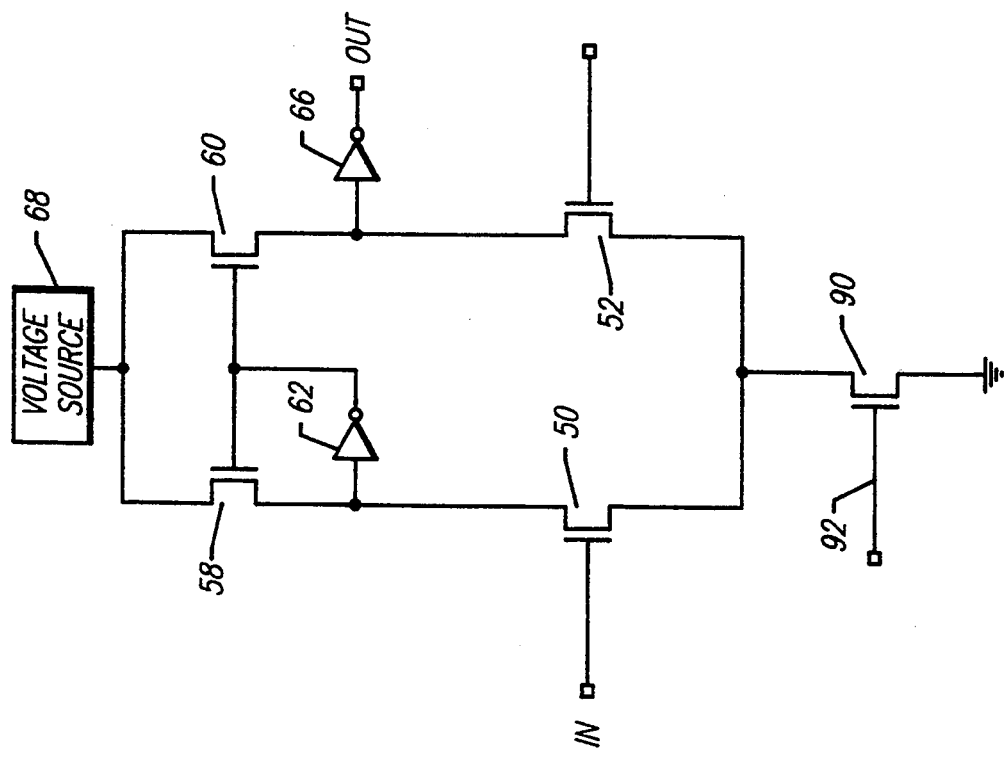
FIG. 6 is a circuit diagram of a further embodiment of the invention for converting a differential input to a single-ended output.

FIG. 6 illustrates a further embodiment of the invention. The embodiment shown in FIG. 6 is identical to the embodiment shown in FIG. 3 except that it includes an additional transistor 90 which may be a MOS transistor of the n-type. The drain of the transistor 90 is common with the sources of the transistors 50 and 52. The gate of the transistor 90 receives a bias voltage on a line 92 to provide a substantially constant current through the transistor. The source of the transistor 90 is at a reference voltage such as ground.

Since the transistor 90 provides a substantially constant current, the embodiment shown in FIG. 6 operates on a differential basis to divide the current between the two (2) branches in accordance with the characteristics of the differential input signals introduced to the gates of the transistors 50 and 52. This tends to regulate the voltage at the output of the amplifier-inverter 66. It will be appreciated by a person of ordinary skill in the art that the embodiments shown in FIGS. 5 and 6 can be combined to produce an additional embodiment.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:
1. In combination,
first and second transistors each having first, second and third terminals,
first means for respectively introducing complementary input voltages to the second terminals of the first and second transistors,
third and fourth transistors each having first, second and third terminals,
the first terminal of the first transistor and the third terminal of the third transistor having a common connection,
the first terminal of the second transistor and the third terminal of the fourth transistor having a common connection,
second means for applying an energizing voltage to the first terminals of the third and fourth transistors,
an amplifier-inverter having a first terminal connected to the first terminal of the first transistor and the third terminal of the second transistor and having a second terminal connected to the second terminals of the third and fourth transistors,
third means for providing an output at the common connection between the first terminal of the second transistor and the third terminal of the fourth transistor, and
fourth means connected to the third terminals of the first and second transistors for producing a substantially constant flow of current through the fourth means from the first, second, third and fourth transistors.

2. In a combination as set forth in claim 1,
the first, second, third and fourth transistors constituting MOS transistors.

3. In a combination as set forth in claim 1,
the amplifier-inverter constituting a first amplifier inverter,
the first, second, third and fourth transistors constituting MOS transistors of the n-type, and
the third means including an additional amplifier-inverter.

4. In a combination as set forth in claim 1,
the fourth means including a fifth transistor having first, second and third terminals,
the first terminal of the fifth transistor being connected to the third terminals of the first and second transistors,
a reference potential,
the third terminal of the fifth transistor being connected to the reference potential, and
fifth means for applying a biasing voltage to the second terminal of the fifth transistor to obtain a substantially constant flow of current through the fifth transistor from the first, second, third and fourth transistors.

5. In a combination as set forth in claim 4,
the first, second, third, fourth and fifth transistors constituting MOS transistors.

6. In a combination as set forth in claim 4,
the amplifier-inverter constituting a first amplifier-inverter,
the first, second, third, fourth and fifth transistors constituting MOS transistors of the n-type, and
the third means including an additional amplifier-inverter.

7. In combination,
first and second transistors each having first, second and third terminals,
first means for respectively introducing complementary input voltages to the second terminals of the first and second transistors,
third and fourth transistors each having first, second and third terminals,
the first terminal of the first transistor and the third terminal of the third transistor having a common connection,
the first terminal of the second transistor and the third terminal of the fourth transistor having a common connection,
second means for applying an energizing voltage to the first terminals of the third and fourth transistors,
an amplifier-inverter having a first terminal connected to the first terminal of the first transistor and the third terminal of the second transistor and having a second terminal, third means for providing an output at the common connection between the first terminal of the second transistor and the third terminal of the fourth transistor, and fourth means connected to the second terminal of the amplifier-inverter and to the second terminals of the third and fourth transistors for compensating in the third means for the voltage drop between the second and third terminals of the fourth transistor, a reference potential, the third terminals of the first and second transistors and the fourth means being connected to the reference potential.

8. In a combination as set forth in claim 7, the first, second, third and fourth transistors constituting MOS transistors.

9. In a combination as set forth in claim 7, the first, second, third and fourth transistors constituting MOS transistors of the n-type, the amplifier-inverter constituting a first amplifier-inverter, and the third means including an additional amplifier-inverter.

10. In a combination as set forth in claim 7, the fourth means including fifth means for producing a voltage drop corresponding to the voltage drop between the second and third terminals of the fourth transistor, the fifth means being connected to the second terminal of the amplifier-inverter and to the second terminals of the third and fourth transistors, and the fourth means including sixth means connected to the fifth means to produce a substantially constant current through the fifth means.

11. In a combination as set forth in claim 7, the fourth means including fifth and sixth transistors each having first, second and third terminals, the third terminal of the fifth transistor being connected to the reference potential, the second terminal of the fifth transistor being connected to the second terminal of the amplifier-inverter, the first terminal of the fifth transistor and the third terminal of the sixth transistor having a common connection, the first terminal of the sixth transistor being connected to the energizing voltage means, and means for introducing a substantially constant biasing voltage to the second terminal of the sixth transistor to produce a substantially constant current through the fifth and sixth transistors.

12. In a combination as set forth in claim 11, the first, second, third, fourth, fifth and sixth transistors constituting MOS transistors.

13. In a combination as set forth in claim 11, the amplifier-inverter constituting a first amplifier-inverter, the first, second, third, fourth, fifth and sixth transistors constituting MOS transistors of the n-type, the third means including an additional amplifier-inverter.

* * * * *